United States Patent
Miyahara et al.

(10) Patent No.: US 10,475,665 B2
(45) Date of Patent: Nov. 12, 2019

(54) HEATING METHOD, FILM FORMING METHOD, SEMICONDUCTOR DEVICE MANUFACTURING METHOD, AND FILM FORMING APPARATUS

(71) Applicant: TOKYO ELECTRON LIMITED, Tokyo (JP)

(72) Inventors: Takahiro Miyahara, Nirasaki (JP); Hiroki Murakami, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/926,380

(22) Filed: Mar. 20, 2018

(65) Prior Publication Data

US 2018/0277389 A1    Sep. 27, 2018

(30) Foreign Application Priority Data

Mar. 23, 2017    (JP) .................. 2017-057511

(51) Int. Cl.
*H01L 21/324* (2006.01)
*H01L 21/02* (2006.01)
(Continued)

(52) U.S. Cl.
CPC ...... *H01L 21/324* (2013.01); *C23C 16/45519* (2013.01); *C23C 16/46* (2013.01); *C23C 16/52* (2013.01); *H01L 21/0228* (2013.01); *H01L 21/0262* (2013.01); *H01L 21/02178* (2013.01); *H01L 21/02181* (2013.01); *H01L 21/02186* (2013.01); *H01L 21/02189* (2013.01); *H01L 21/02192* (2013.01); *H01L 21/02271* (2013.01); *H01L 21/02312* (2013.01); *H01L 21/02381* (2013.01); *H01L 21/02488* (2013.01); *H01L 21/02532* (2013.01); *H01L 21/02664* (2013.01); *H01L 21/26513* (2013.01); *H01L 21/28088* (2013.01); *H01L 21/28158* (2013.01);
(Continued)

(58) Field of Classification Search
CPC ............ H01L 21/324; H01L 21/02664; H01L 29/786; H01L 21/28158; H01L 21/02532; H01L 21/02488; H01L 29/66477; H01L 21/02381; H01L 21/26513; H01L 21/28088; H01L 21/02271; H01L 21/02186; H01L 21/02192; H01L 21/02178; H01L 21/02189; H01L 21/02181; H01L 21/0262; C23C 16/45519; C23C 16/46; C23C 16/52; C23C 16/40

See application file for complete search history.

(56) References Cited

U.S. PATENT DOCUMENTS

2007/0196011 A1* 8/2007 Cox ..................... G01N 21/33
                                                                              382/145

FOREIGN PATENT DOCUMENTS

JP    2008-71814 A    3/2008
JP    2010-34580 A    2/2010

* cited by examiner

*Primary Examiner* — Kyoung Lee
(74) *Attorney, Agent, or Firm* — Nath, Goldberg & Meyer; Jerald L. Meyer (57) ABSTRACT

There is provided heating method for heating a substrate having a germanium film or a silicon germanium film formed on a surface of the substrate, the method including: loading the substrate kept in an air atmosphere at least a predetermined time into a processing container; and heating the substrate in a state in which an interior of the processing container is kept in a hydrogen gas-containing atmosphere.

9 Claims, 10 Drawing Sheets

(51) Int. Cl.
*H01L 21/28* (2006.01)
*H01L 21/265* (2006.01)
*H01L 29/66* (2006.01)
*C23C 16/46* (2006.01)
*C23C 16/455* (2006.01)
*C23C 16/52* (2006.01)
*H01L 29/786* (2006.01)
*C23C 16/40* (2006.01)

(52) U.S. Cl.
CPC ...... *H01L 29/66477* (2013.01); *H01L 29/786* (2013.01); *C23C 16/40* (2013.01)

N₂ gas atmosphere

| Initial | 600°C | 550°C | 500°C | 450°C |
|---|---|---|---|---|
|  | No change | No change | No change |  |
| 44.5nm | 43.9nm | 44.4nm | 46.0nm |  |

HEATING METHOD, FILM FORMING METHOD, SEMICONDUCTOR DEVICE MANUFACTURING METHOD, AND FILM FORMING APPARATUS

CROSS-REFERENCE TO RELATED APPLICATION

This application is based upon and claims the benefit of priority from Japanese Patent Application No. 2017-057511, filed on Mar. 23, 2017, the entire contents of which are incorporated herein by reference.

TECHNICAL FIELD

The present disclosure relates to a heating method for heating a substrate having a germanium film or a silicon germanium film on its surface, a film forming method, a semiconductor device manufacturing method, and a film forming apparatus.

BACKGROUND

Recently, high speed operation has been required for semiconductor integrated circuit devices. Speedup of the operation is mainly towed by the miniaturization of semiconductor devices such as transistors or the like, the reduction in wiring resistance, the reduction in dielectric constant of interlayer insulating films, and the like. However, the speedup of operation by these techniques has reached its limits.

Therefore, in order to further speed up the operation, germanium (Ge) or silicon germanium (SiGe), which is a semiconductor material having higher carrier mobility, is used in place of silicon (Si) which is a conventionally used semiconductor material. The application of germanium (Ge) or silicon germanium (SiGe) to a channel portion material of a transistor has been studied.

Incidentally, a high dielectric constant film (High-k film) is frequently used as a gate insulating film on a channel portion made of Ge or SiGe in response to miniaturization. There is a need for a high quality film with few impurities. Therefore, it is sometimes required to form a high-k film at a temperature exceeding 450 degrees C., particularly at a high temperature of 500 to 600 degrees C.

However, after the substrate having a Ge film or a SiGe film on its surface is loaded into a processing container from an air atmosphere and is heated to a temperature exceeding 450 degrees C., the Ge film or the SiGe film is etched and there is a high amount of deterioration of the surface of the substrate. For this reason, the film is formed at a temperature lower than the original temperature, or a special method such as flash lamp annealing or the like is used in which only the outermost surface is affected by temperature.

SUMMARY

Some embodiments of the present disclosure provide a technique in which, when a substrate having a Ge film or a SiGe film on the surface thereof is loaded into a processing container from an air atmosphere and is heated, the surface of the Ge film or the SiGe film is less likely to be degraded even at a temperature higher than 450 degrees C.

According to one embodiment of the present disclosure, there is provided a heating method for heating a substrate having a germanium film or a silicon germanium film formed on a surface of the substrate, the method including: loading the substrate kept in an air atmosphere at least a predetermined time into a processing container; and heating the substrate in a state in which an interior of the processing container is kept in a hydrogen gas-containing atmosphere.

According to another embodiment of the present disclosure, there is provided a film forming method for forming a high dielectric constant film on a substrate having a germanium film or a silicon germanium film formed on a surface of the substrate, the method including: loading the substrate kept in an air atmosphere at least a predetermined time into a processing container of a film forming apparatus; heating the substrate at least up to a film formation temperature in a state in which an interior of the processing container is kept in a hydrogen gas-containing atmosphere; and forming the high dielectric constant film on a surface of the germanium film or the silicon germanium film by supplying a film forming raw material gas for forming the high dielectric constant film and an oxidizing gas after the substrate has reached the film formation temperature.

According to still another embodiment of the present disclosure, there is provided a film forming apparatus for forming a high dielectric constant film on a substrate having a germanium film or a silicon germanium film formed on a surface of the substrate, the apparatus including: a processing container configured to accommodate the substrate having the germanium film or the silicon germanium film formed on the substrate; a gas supply part configured to supply a predetermined gas for forming the high dielectric constant film into the processing container; a heater configured to heat an interior of the processing container; an exhaust mechanism configured to evacuate the interior of the processing container to bring the processing container into a depressurized state; and a controller configured to control the gas supply part, the heater and the exhaust mechanism, wherein the controller controls a pressure of the interior of the processing container to a predetermined depressurized state using the exhaust mechanism, controls a temperature of the interior of the processing container to a predetermined temperature using the heater, and controls gas supply from the gas supply part so that the interior of the processing container is kept in a predetermined hydrogen gas-containing atmosphere during at least a time period in which a temperature of the substrate reaches a film formation temperature of the high dielectric constant film.

According to yet another embodiment of the present disclosure, there is provided a semiconductor device manufacturing method, including: forming a germanium film or a silicon germanium film on a semiconductor substrate via an insulating film; forming a high dielectric constant film on the germanium film or the silicon germanium film; forming a conductive film on the high dielectric constant film; and forming a channel portion composed of the germanium film or the silicon germanium film, a source electrode, a drain electrode, a gate insulating film composed of the high dielectric constant film, and a gate electrode composed of the conductive film, by etching the conductive film and the high dielectric constant film, and by implanting ions into the germanium film or the silicon germanium film, wherein after forming the germanium film or the silicon germanium film, the semiconductor substrate kept in an air atmosphere at least a predetermined time is loaded into a processing container of a film forming apparatus for forming the high dielectric constant film, and the semiconductor substrate is heated at least up to a film formation temperature in a state in which an interior of the processing container is kept in a hydrogen gas-containing atmosphere.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

Figure 1:
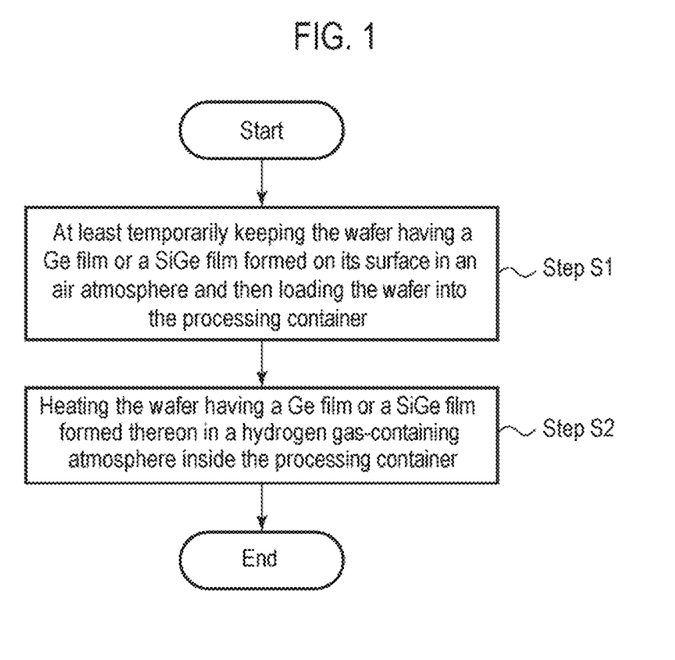
FIG. 1 is a flowchart showing a heating method according to a first embodiment.

First, as a first embodiment, a basic example of a heating method according to the present disclosure will be described. FIG. 1 is a flowchart showing a heating method of the first embodiment. In this example, first, as a substrate, a semiconductor wafer (hereinafter simply referred to as a wafer) such as a silicon wafer or the like having a Ge film or a SiGe film formed on its surface is kept for at least a predetermined time in an air atmosphere and is then loaded into a processing container (step S1).

A Ge film or a SiGe film of a wafer having the Ge film or the SiGe film formed on the surface thereof is used as, for example, a channel portion of a transistor. As the SiGe film, a Ge-rich SiGe film may be used, particularly a SiGe film containing Si of 10 at. % or less may be used.

Next, a wafer having the Ge film or the SiGe film formed thereon is heated in the processing container (step S2). In the present embodiment, an atmosphere containing a hydrogen gas ($H_2$ gas) is used at the time of heating.

The heating is not particularly limited and may be, for example, the heating to a film formation temperature in a film forming apparatus for forming a high-k film as a gate insulating film on a channel portion of a transistor formed of a Ge film or a SiGe film.

Conventionally, in such heating, an inert atmosphere in a depressurized state is created by supplying an inert gas, such as an $N_2$ gas or an Ar gas, as a purge gas into a processing container while evacuating the inside of the processing container.

However, for example, when a high-k film is formed as a gate insulating film, a high temperature of 450 degrees C. or higher, particularly 500 to 600 degrees C. may sometimes be required in order to form a high-quality film containing few impurities. However, it was found that, if a wafer having a Ge film or a SiGe film formed thereon is loaded into a processing container from an air atmosphere and is heated therein to a high temperature of 450 or higher in an inert gas atmosphere as in the conventional technology, the Ge film or the SiGe film is etched.

Figure 2:
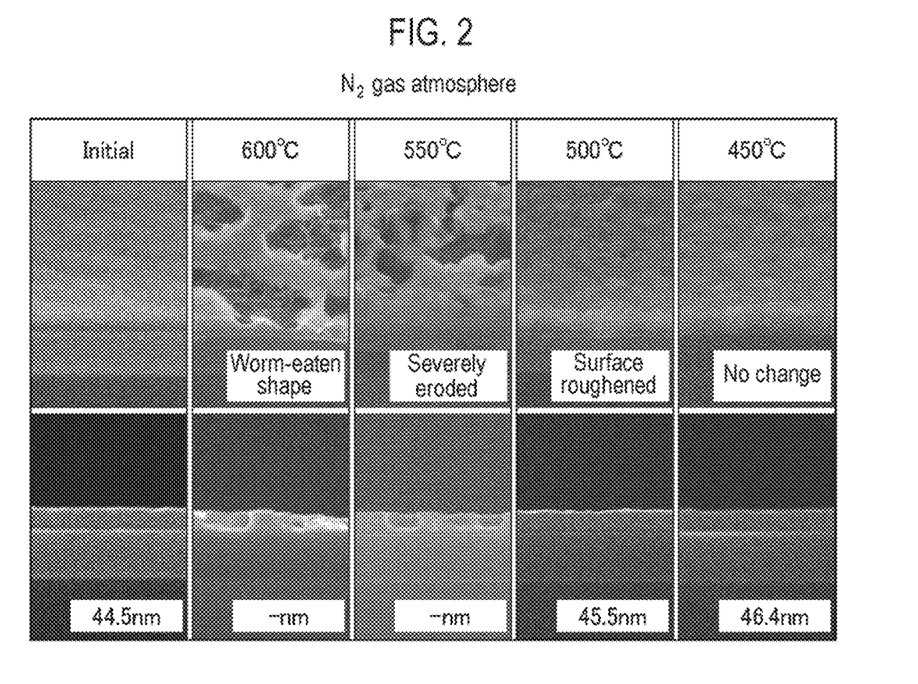
FIG. 2 is a view showing planar and sectional SEM photographs of a sample obtained by forming a Ge film having a film thickness of about 45 nm on a SiN film, which are taken when the sample is heated at a heating temperature of 450 degrees C., 500 degrees C., 550 degrees C. and 600 degrees C. in an $N_2$ gas atmosphere.

Experiments for verifying this phenomenon will be described below. FIG. 2 is a view showing planar and sectional scanning electron microscope (SEM) photographs of a sample obtained by forming a Ge film having a film thickness of about 45 nm on a SiN film, which are taken when the sample is heated at a heating temperature of 450 degrees C., 500 degrees C., 550 degrees C. and 600 degrees C. in an $N_2$ gas atmosphere ($N_2$ gas flow rate: 1000 sccm). The pressure is 0.5 Torr and the holding time is 10 sec.

As shown in FIG. 2, at 450 degrees C., no change is observed in the Ge film, but a slight surface roughness is observed at 500 degrees C. The Ge film is severely eroded at 550 degrees C. or higher, and the Ge film has a worm-eaten shape at 600 degrees C. As shown in FIG. 2, the eroded portion has a shape of a steep pit. Therefore, it is considered that this erosion is due to etching rather than migration.

As a result of studying the mechanism of such etching, it was conceived that the mechanism of etching is as follows. The mechanism of etching will be described with reference to FIGS. 3A to 3D.

Figure 3A:
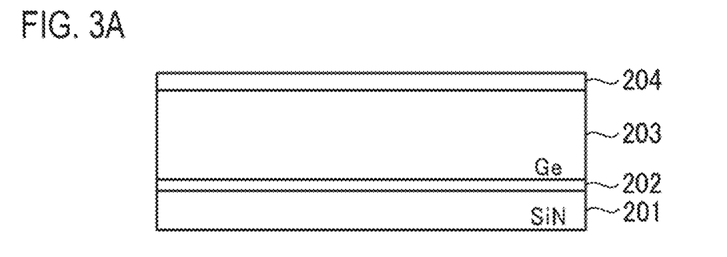
FIGS. 3A to 3D are schematic views for explaining an etching mechanism when heated in an $N_2$ gas atmosphere.

In the initial state before heating, a wafer is held in an air atmosphere. Therefore, as shown in FIG. 3A, a Ge film 203 is formed on the underlying SiN film 201 via a natural oxide film 202 formed on the surface of the SiN film 201, and a natural oxide film 204 is formed on the surface of the Ge film 203.

Figure 3B:
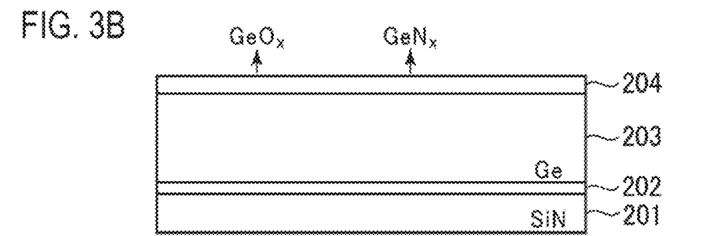

It is considered that the Ge film 203 is normally formed by chemical vapor deposition (CVD) and Ge is present in a hydride state. When the wafer on which the Ge film 203 is formed is heated in an $N_2$ gas atmosphere, initially, as shown in FIG. 3B, a reaction of generating and vaporizing $GeO_2$ proceeds due to a reaction between germanium hydride and $O_2$ in the natural oxide film as represented by the following formula (1), and a reaction of generating and vaporizing GeN proceeds due to a reaction with an $N_2$ gas as represented by the following formula (2).

$$GeH_4 + O_2 \Leftrightarrow GeO_2\uparrow + 2H_2 \quad (1)$$

$$2GeH_4 + N_2 \Leftrightarrow 2GeN\uparrow + 4H_2 \quad (2)$$

Figure 3C:
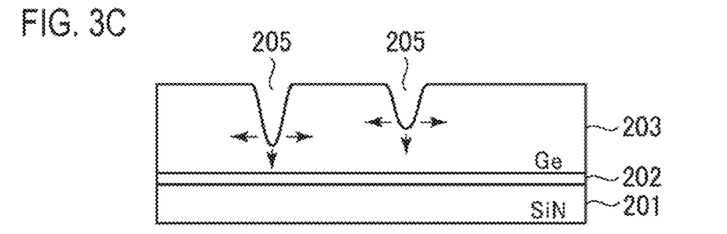
Figure 3D:
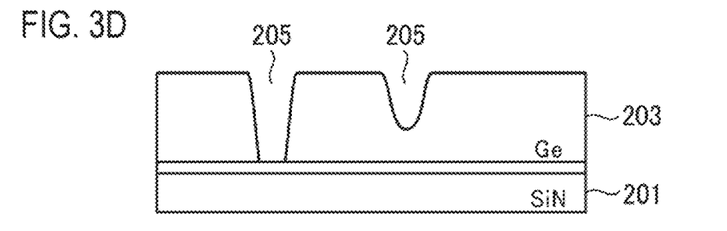

These reactions proceed in a temperature increasing process. The Ge film 203 is locally etched to form holes 205 as shown in FIG. 3C. Finally, as shown in FIG. 3D, the holes 205 penetrate the Ge film 203 in the thickness direction thereof.

When a rare gas such as an Ar gas or the like is used as the inert gas, the reaction of formula (2) does not occur, but the reaction of formula (1) proceeds after all etching occurs.

Such a phenomenon similarly occurs in the SiGe film and is remarkable in a Ge-rich SiGe film, particularly in a SiGe film containing Si of 10 at. % or less.

If etching occurs in such a mechanism, in order to suppress the etching, it is necessary to make sure that the reactions of the aforementioned formulae (1) and (2) do not proceed to the right side. For this purpose, it is effective to shift the chemical equilibrium reactions of formulae (1) and (2) to the left side (undegraded side) by supplying excessive hydrogen.

Figure 4A:
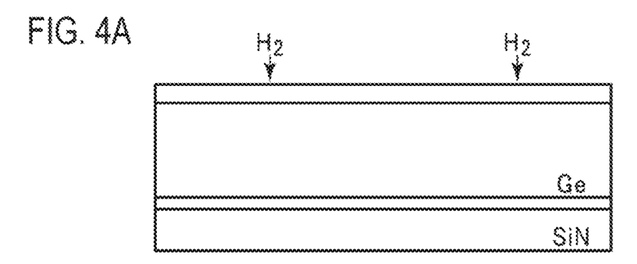
FIGS. 4A and 4B are schematic views for explaining a state when heated in an atmosphere containing a $H_2$ gas.
Figure 4B:
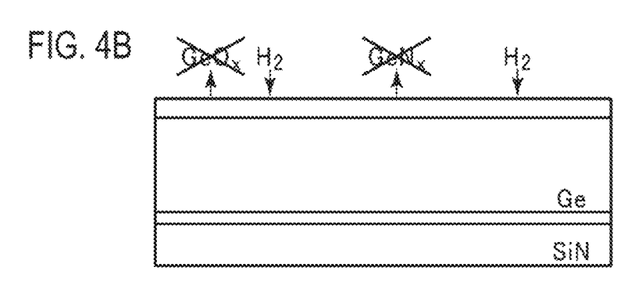

That is, when an atmosphere containing a $H_2$ gas is used while heating the wafer W on which the Ge film or the SiGe film is formed, even if heating is performed from the initial state shown in FIG. 4A, the aforementioned formulae (1) and (2) do not proceed to the right side. Therefore, even if heating is performed, $GeO_2$ and GeN shown in FIG. 4B are not generated, and etching does not occur.

Figure 5:
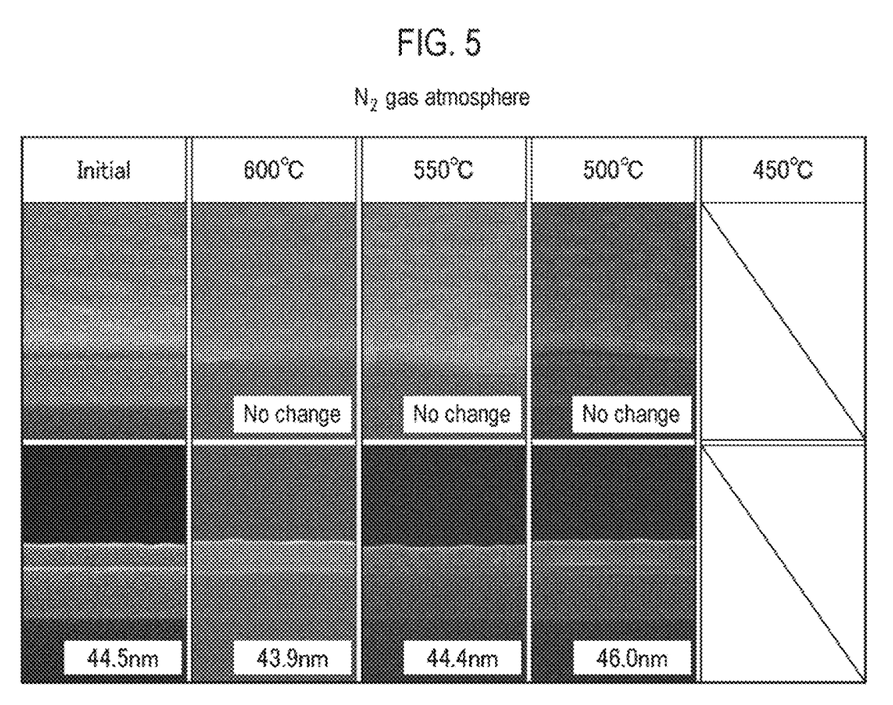
FIG. 5 is a view showing planar and sectional SEM photographs of a sample obtained by forming a Ge film having a film thickness of about 45 nm on a SiN film, which are taken when the sample is heated at a heating temperature of 500 degrees C., 550 degrees C. and 600 degrees C. in a $H_2$ gas atmosphere.

FIG. 5 shows planar and sectional SEM photographs of an actual sample obtained by forming a Ge film having a film thickness of about 45 nm on a SiN film, which are taken when the sample is heated at a heating temperature of 500 degrees C., 550 degrees C. and 600 degrees C. in a $H_2$ gas atmosphere ($H_2$ flow rate: 5000 sccm). The pressure at this time is 0.5 Torr and the holding time is 10 sec. The $H_2$ gas continues to flow from the temperature rise until the temperature drops.

As shown in the SEM photographs of FIG. 5, it was confirmed that, up to 600 degrees C., no change is observed in the Ge film, and etching is suppressed.

As described above, according to the present embodiment, when the wafer W on which the Ge film or the SiGe film is formed is kept in the air atmosphere for at least a predetermined time and is then loaded into the processing container to heat the wafer W, the inside of the processing container is kept in an atmosphere containing a $H_2$ gas. Thus, it is possible, even when performing high temperature heating, to suppress the degradation of the surface of the Ge film or the SiGe film which may otherwise be caused by etching.

In the heating in step S2, only the $H_2$ gas may be allowed to flow in the $H_2$ gas atmosphere, or a rare gas such as an Ar gas or an inert gas such as an $N_2$ gas may be added to the $H_2$ gas. In addition, when a treatment such as a sulfurization treatment for interface control is performed together with the heating, a processing gas for performing the treatment, for example, a $H_2S$, may be added to the $H_2$ gas.

Incidentally, a conventional technique has been used that a SiGe film is formed and then annealed by supplying a hydrogen gas into a reaction container. In this technique, in order to prevent migration which may occur after the formation of the SiGe film, annealing is performed in the reaction container in which the film formation is performed. However, this technique is quite different from the present disclosure that suppresses etching when the wafer W having the Ge film or the SiGe film formed thereon is loaded into the processing container from the air atmosphere and is heated.

Second Embodiment

Next, as a second embodiment, an example in which the heating method of the present disclosure is applied to a case where a high-k film is formed on a wafer W having a Ge film or a SiGe film formed thereon will be described.

[Film Forming Apparatus]

Figure 6:
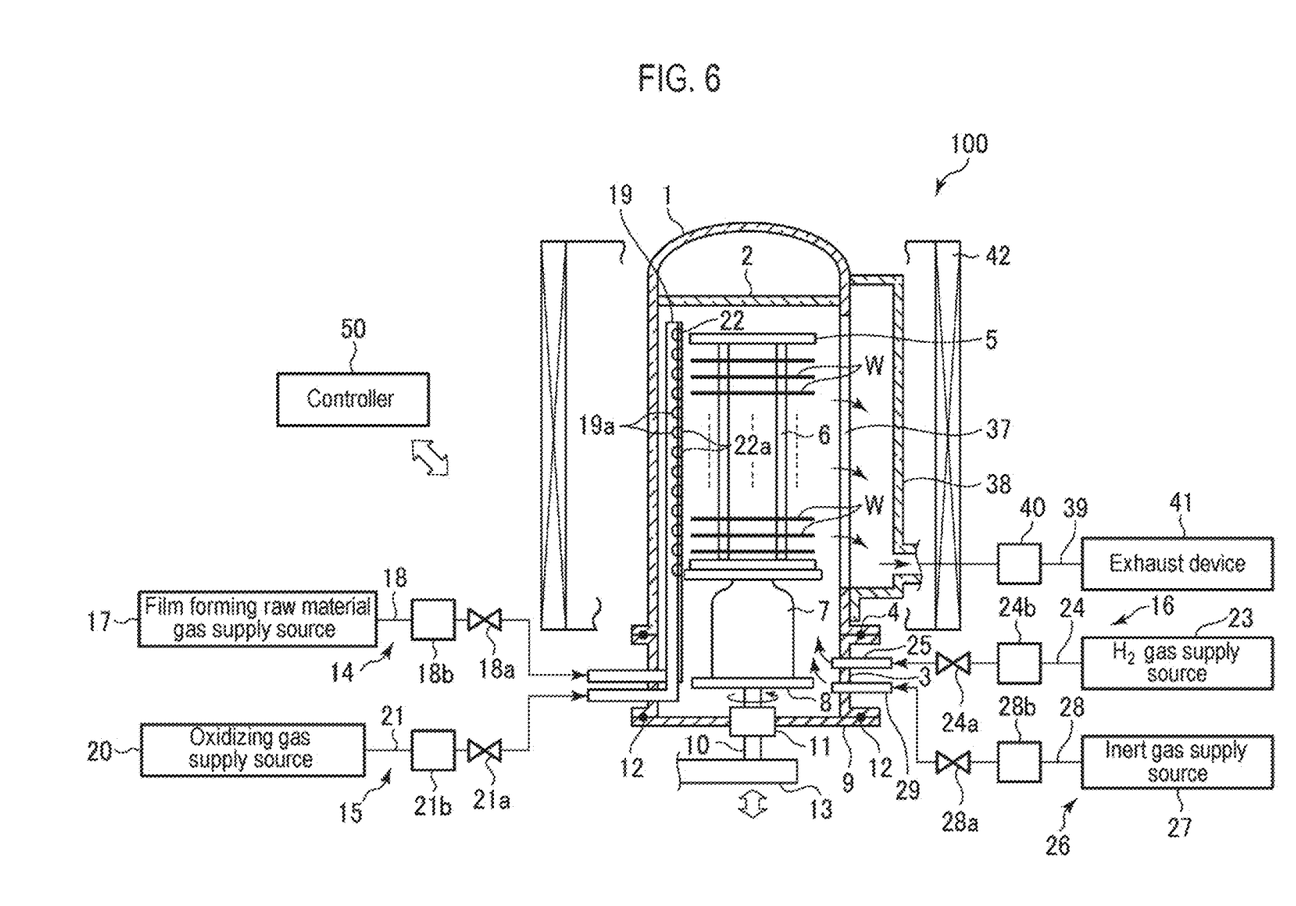
FIG. 6 is a vertical sectional view showing an example of a film forming apparatus for forming a high-k film used in a second embodiment.
Figure 7:
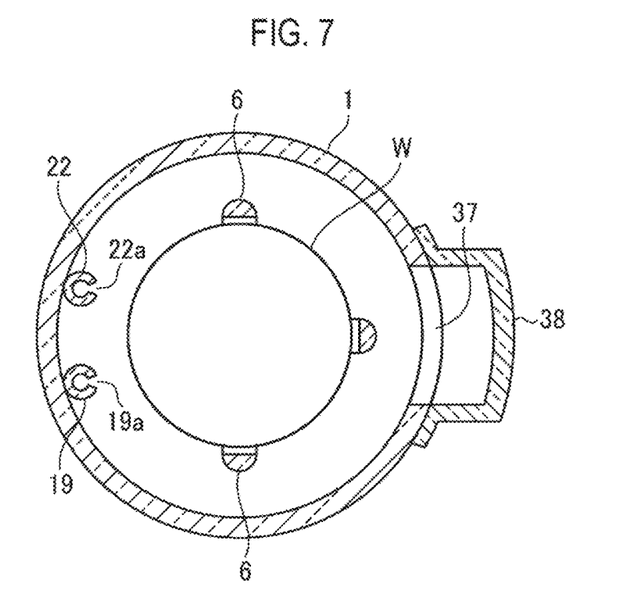
FIG. 7 is a horizontal sectional view of the film forming apparatus shown in FIG. 6.

First, an example of a film forming apparatus for forming a high-k film will be described. FIG. 6 is a vertical sectional view showing the film forming apparatus, and FIG. 7 is a horizontal sectional view of the film forming apparatus shown in FIG. 6.

The film forming apparatus of this example is a vertical batch type film forming apparatus in which a high-k film is formed on a semiconductor wafer (hereinafter simply referred to as a wafer) which is a substrate having a Ge film or a SiGe film formed on its surface.

The film forming apparatus 100 of this example includes a cylindrical processing container 1 having a ceiling and an open lower end. The entire processing container 1 is made of, for example, quartz. A ceiling plate 2 made of quartz is provided near the ceiling inside the processing container 1 to seal the ceiling. As will be described later, the processing container 1 is configured to be heated by a heater and is configured as a film forming apparatus of a hot wall type. A manifold 3 formed into a cylindrical shape by, for example, stainless steel, is connected to a lower end opening portion of the processing container 1 via a seal member 4 such as an O ring or the like.

The manifold 3 supports the lower end of the processing container 1. A quartz-made wafer boat 5 holding 50 to 150 wafers W mounted in multiple stages can be inserted into the processing container 1 from below the manifold 3. The wafer boat 5 includes three support columns 6 (see FIG. 7). A large number of wafers W are supported by grooves formed in the support columns 6.

The wafer boat 5 is placed on a table 8 via a quartz-made heat-insulating cylinder 7. The table 8 is supported on a rotary shaft 10 that penetrates a lid 9 made of, for example, stainless steel, and configured to open and close a lower end opening portion of the manifold 3.

For example, a magnetic fluid seal 11 is provided in a penetrating portion of the rotary shaft 10 and is configured to rotatably support the rotary shaft 10 while air-tightly sealing the rotary shaft 10. In addition, a seal member 12 made of, for example, an O ring, is interposed between the peripheral portion of the lid 9 and a lower end portion of the manifold 3, thereby maintaining the sealing of the inside of the processing container 1.

The rotary shaft 10 is attached to a tip of an arm 13 supported by an elevating mechanism (not shown) such as, for example, a boat elevator, so that the wafer boat 5, the lid 9 and the like can be integrally elevated and inserted into the processing container 1. Alternatively, the table 8 may be fixedly provided on the side of the lid 9 and the wafer W may be processed without rotating the wafer boat 5.

The film forming apparatus 100 includes a film forming raw material gas supply mechanism 14 configured to supply a film forming raw material gas for forming a high-k film into the processing container 1, an oxidizing gas supply mechanism 15 configured to supply an oxidizing gas into the processing container 1, an H$_2$ gas supply mechanism 16 configured to supply a hydrogen gas (H$_2$ gas) into the processing container 1, and an inert gas supply mechanism 26 configured to supply an inert gas, for example, an N$_2$ gas or an Ar gas, into the processing container 1.

The film forming raw material gas supply mechanism 14 includes a film forming raw material gas supply source 17, a film forming raw material gas pipe 18 configured to introduce a raw material gas from the film forming raw material gas supply source 17, and a film forming raw material gas dispersion nozzle 19 connected to the film forming raw material gas pipe 18 and formed of a quartz pipe inwardly penetrating the side wall of the manifold 3, bending upward and extending vertically. In the film forming material gas dispersion nozzle 19, a plurality of gas discharge holes 19a are formed at predetermined intervals along the length direction so that the film forming raw material gas can be substantially uniformly discharged from the respective gas discharge holes 19a toward the wafers W inside the processing container 1 in the horizontal direction.

The oxidizing gas supply mechanism 15 includes an oxidizing gas supply source 20, an oxidizing gas pipe 21 configured to introduce an etching gas from the oxidizing gas supply source 20, and an oxidizing gas dispersion nozzle 22 connected to the oxidizing gas pipe 21 and formed of a quartz pipe inwardly penetrating the side wall of the manifold 3, bending upward and extending vertically. In the oxidizing gas dispersion nozzle 22, a plurality of gas discharge holes 22a are formed at predetermined intervals along the length direction so that the oxidizing gas can be substantially uniformly discharged from the respective gas discharge holes 22a toward the wafers W inside the processing container 1 in the horizontal direction.

The H$_2$ gas supply mechanism 16 includes an H$_2$ gas supply source 23, an H$_2$ gas pipe 24 configured to introduce an H$_2$ gas from the H$_2$ gas supply source 23, and an H$_2$ gas nozzle 25 connected to the H$_2$ gas pipe 24 and formed of a quartz pipe inwardly penetrating the side wall of the manifold 3.

The inert gas supply mechanism 26 includes an inert gas supply source 27, an inert gas pipe 28 configured to introduce an inert gas from the inert gas supply source 27, and an inert gas nozzle 29 connected to the inert gas pipe 28 and provided to penetrate the side wall of the manifold 3.

An opening/closing valve 18a and a flow rate controller 18b such as a mass flow controller or the like are provided in the film forming raw material gas pipe 18 so that the film forming raw material gas can be supplied while controlling the flow rate of the film forming raw material gas. An opening/closing valve 21a and a flow rate controller 21b are provided in the oxidizing gas pipe 21 so that the oxidizing gas can be supplied while controlling the flow rate of the oxidizing gas. An opening/closing valve 24a and a flow rate controller 24b are provided in the H$_2$ gas pipe 24 so that the H$_2$ gas can be supplied while controlling the flow rate of the H$_2$ gas. An opening/closing valve 28a and a flow rate controller 28b such as a mass flow controller or the like are provided in the inert gas pipe 28 so that the inert gas can be supplied while controlling the flow rate of the inert gas.

The film forming raw material gas dispersion nozzle 19 and the oxidizing gas dispersion nozzle 22 are provided on one side of the processing container 1. On the opposite side of the processing container 1 from the nozzles 19 and 22, an exhaust port 37 for evacuating the inside of the processing container 1 is formed in an elongated shape along the vertical direction of the side wall of the processing container 1. An exhaust port cover member 38 shaped to have a U-like cross section so as to cover the exhaust port 37 is provided in a portion of the processing container 1 corresponding to the exhaust port 37. An exhaust pipe 39 for evacuating the inside of the processing container 1 via the exhaust port 37 is connected to a lower portion of the exhaust port cover member 38. A pressure control valve 40 for controlling the pressure inside the processing container 1 and an exhaust device 41 including a vacuum pump or the like are connected to the exhaust pipe 39. The inside of the processing container 1 is evacuated by the exhaust device 41 through the exhaust pipe 39, and adjusted to a predetermined depressurized state. An exhaust mechanism (exhaust part) of the film forming apparatus 100 includes the exhaust port 37, the exhaust port cover member 38, the exhaust pipe 39 and the exhaust device 41.

A cylindrical heater 42 for heating the processing container 1 and the wafers W inside the processing container 1 is provided outside the processing container 1 so as to surround the processing container 1.

The film forming apparatus 100 includes a controller 50. The controller 50 controls the respective components of the film forming apparatus 100, for example, valves, mass flow controllers as flow rate controllers, drive mechanisms such as an elevating mechanism and the like, a heater power source, and the like. The controller 50 is formed of a CPU (computer), and includes a main controller for performing the aforementioned control, an input device, an output device, a display device and a memory device. In the memory device, a storage medium stores a program, i.e., a process recipe, for controlling the processing to be executed in the film forming apparatus 100. The main controller reads a predetermined processing recipe stored in the storage medium and controls the film forming apparatus 100 to perform a predetermined process based on the process recipe.

[Film Forming Method]

Next, an example of a film formation method executed using the above-described film forming apparatus will be described. In this example, a high-k film such as a gate insulating film is formed on a wafer W having a Ge film or a SiGe film formed, for example, as a channel portion, on its surface.

For film formation, a plurality of, for example, 50 to 150, wafers W, each of which has a Ge film or a SiGe film formed thereon, are mounted on the wafer boat 5 in an air atmosphere. The wafer boat 5 is inserted into the processing container 1 of the film forming apparatus 100 from below so that the plurality of wafers W is accommodated in the processing container 1. Then, by closing the lower end opening portion of the manifold 3 with the lid 9, the space inside the processing container 1 becomes a sealed space. Then, the wafers W are heated to a film formation temperature by the heater 42.

At this time, the H$_2$ gas is supplied into the processing container 1 from the H$_2$ gas supply mechanism 16 while evacuating the interior of the processing container 1 by the exhaust device 41, thereby creating an H$_2$ gas atmosphere in a predetermined depressurized state. An inert gas may be supplied from the inert gas supply mechanism 26 together with the H$_2$ gas. The pressure inside the processing container 1 is set to, for example, 0.1 to 500 Torr (13.33 to 66661.18 Pa), and the flow rate of the H$_2$ gas is set to, for example, 10 to 10000 sccm.

At the time when the temperature of the wafer W reaches a film formation temperature, the film forming raw material gas and the oxidizing gas are supplied from the film forming raw material gas supply mechanism 14 and the oxidizing gas supply mechanism 15 to start forming a high-k film. The formation of the high-k film is performed by CVD or atomic layer deposition (ALD). Examples of the high-k film may include a $HfO_2$ film, a $ZrO_2$ film an $Al_2O_3$ film, a $La_2O_3$ film a $TiO_2$ film, a composite film thereof, and the like. As the film forming raw material, a material suitable for the formation of these films is used. For example, in the case of the $HfO_2$ film, an organic hafnium compound such as tetrakis dimethylamino hafnium $((Hf(NCH_3)_2)_4$:TDMAH) or the like and hafnium chloride ($HfCl_4$) and the like may be used. As the oxidizing gas, an $O_3$ gas, an $H_2O$ gas, an $O_2$ gas, an $NO_2$ gas, an NO gas, an $N_2O$ gas and the like may be used.

When the high-k film is used as a gate insulating film, if impurities are present in the film, the impurities become fixed charges and hinder migration of carriers in the channel portion. For this reason, a high-quality film containing few impurities is needed. For example, when the $HfO_2$ film is used as the high-k film, $H_2O$ exists as an impurity. Thus, $H_2O$ needs to be minimized to the maximum extent. In some cases, a high temperature exceeding 450 degrees C., particularly a high temperature of 500 to 600 degrees C., may be necessary to form the high-k film.

Figure 8:
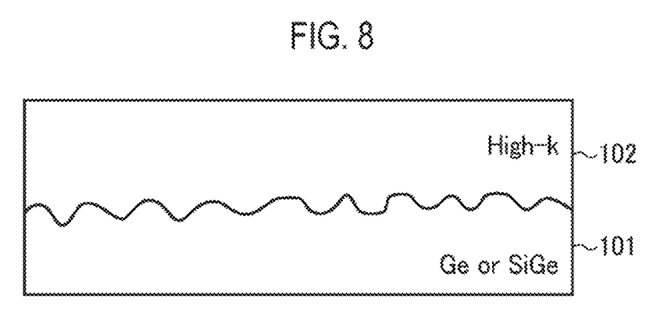
FIG. 8 shows a state of an interface between a Ge film or a SiGe film and a high-k film when a wafer having a Ge film or a SiGe film formed on the surface thereof is heated to a film formation temperature with an inert gas in the case where the film formation temperature of the high-k film exceeds 450 degrees C.

In the case of heating in a conventional inert atmosphere, if the wafer W is heated to such a high film formation temperature exceeding 450 degrees C., a natural oxide film is formed on the surface of the Ge film or the SiGe film of the wafer W. Therefore, as described above, the Ge film or the SiGe film is etched. When a high-k film 102 is formed on the Ge film or the SiGe film thus etched, as shown in FIG. 8, the roughness of the interface between the Ge film or the SiGe film 101 and the high-k film 102 increases. Therefore, when the Ge film or the SiGe film 101 is used as a channel portion, the carrier scattering occurs and the carrier mobility decreases.

On the other hand, in this embodiment, the atmosphere during the heating of the wafer W to the film formation temperature is set to an atmosphere containing an $H_2$ gas. Therefore, the etching of the Ge film or the SiGe film is suppressed as described above. This makes it possible to suppress a decrease in carrier mobility which may be caused by interfacial roughness scattering.

The supply of the $H_2$ gas may be stopped before starting the formation of the high-k film. However, the $H_2$ gas may be continuously supplied during the formation of the high-k film as long as it does not adversely affect the film formation. This makes it possible to reliably prevent the etching of the Ge film or the SiGe film.

After the film formation is completed, the supply of the film forming raw material gas and the oxidizing gas is stopped, and the interior of the processing container 1 is purged. In this purging, an inert gas is used. However, an $H_2$ gas may be added. Thereafter, the interior of the processing container 1 is returned to atmospheric pressure, and the processing is terminated.

Third Embodiment

Figure 9:
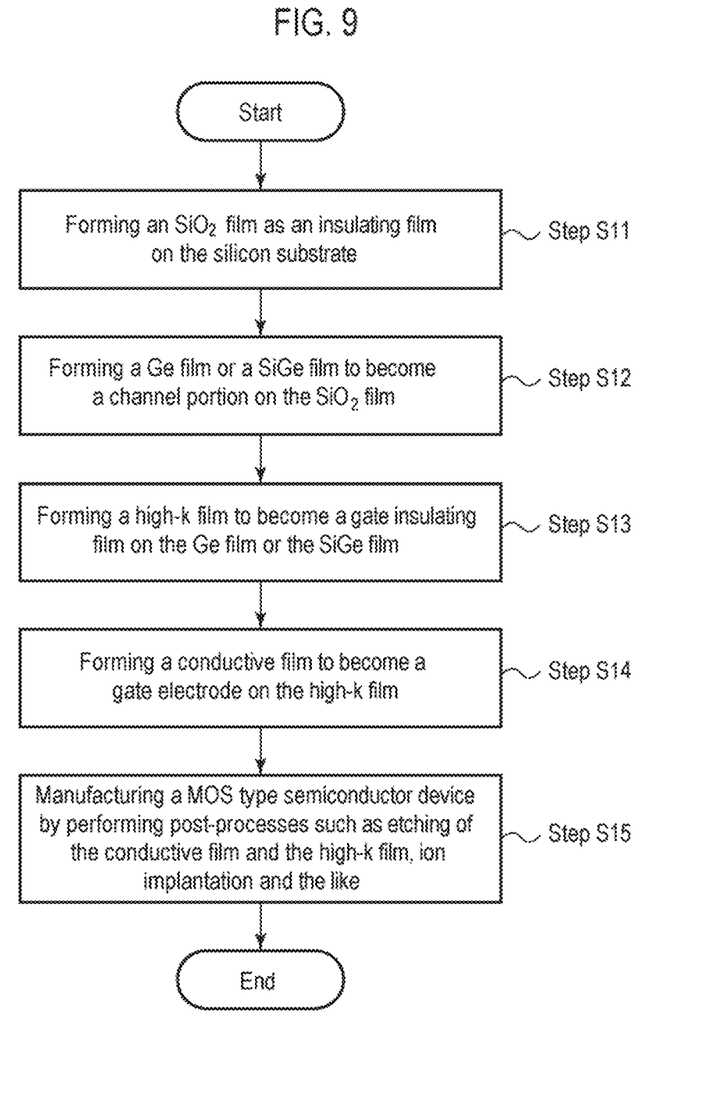
FIG. 9 is a flowchart showing an example of a semiconductor device manufacturing method according to a third embodiment.

In this embodiment, a semiconductor device manufacturing method to which the heating method of the present disclosure is applied will be described. FIG. 9 is a flowchart showing an example of a semiconductor device manufacturing method according to a third embodiment, and FIGS. 10A to 10E are process sectional views thereof.

Figure 10A:
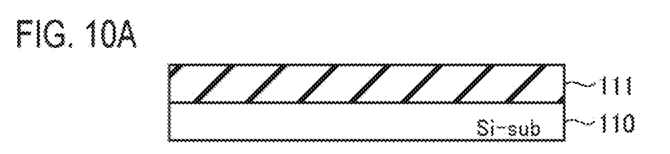
FIGS. 10A to 10E are process sectional views showing an example of the semiconductor device manufacturing method according to the third embodiment.

First, an insulating film, for example, a $SiO_2$ film 111, is formed on a silicon substrate 110, which is a semiconductor substrate, by a conventional method (step S11 and FIG. 10A).

Figure 10B:
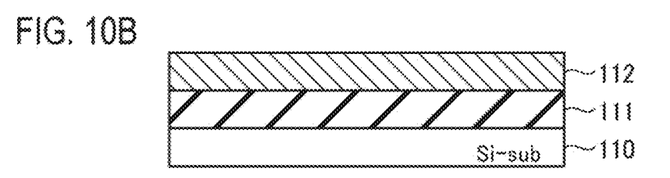

Next, a Ge film or a SiGe film 112 to become a channel portion is formed on the $SiO_2$ film 111 (step S12 and FIG. 10B). At this time, a vertical batch type film forming apparatus similar to that of the second embodiment may be used. The Ge film is formed by a CVD method using a Ge raw material gas, and the SiGe film is formed by a CVD method using a Ge raw material gas and a Si raw material gas. As a Ge raw material, it may be possible to use monogermane ($GeH_4$), digermane ($Ge_2H_6$), an aminogermane-based compound or the like. As a Si raw material, it may be possible to use monosilane ($SiH_4$), disilane ($Si_2H_6$), an aminosilane-based compound or the like.

Figure 10C:
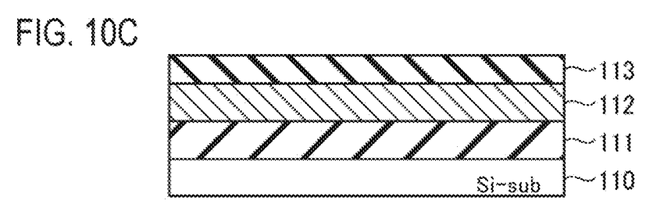

Next, a high-k film 113 to become a gate insulating film is formed on the Ge film or the SiGe film 112 (step S13 and FIG. 10C). After the substrate on which the Ge film or the SiGe film 112 has been formed is taken out into an air atmosphere, the substrate is loaded into the vertical batch type film forming apparatus described in the second embodiment, and then the high-k film 113 is formed on the substrate. At this time, the heating up to at least a film formation temperature is performed in an atmosphere containing an $H_2$ gas.

Figure 10D:
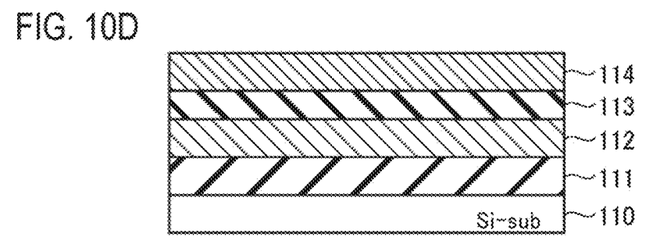

Next, a conductive film 114 to become a gate electrode is formed on the high-k film 113 (step S14 and FIG. 10D). Examples of the conductive film 114 to become a gate electrode may include a polysilicon (Poly-Si) film and a titanium nitride (TiN) film.

Figure 10E:
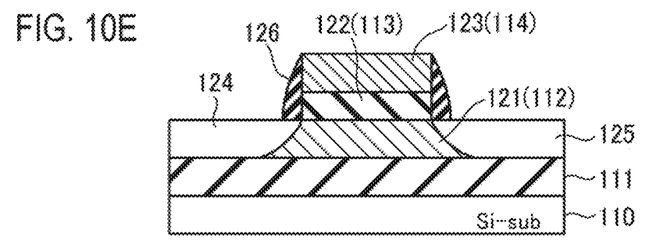

Thereafter, post-processes such as the etching of the conductive film 114 and the high-k film 113, the ion implantation and the like are performed to manufacture a MOS type semiconductor device (field effect transistor) (step S15 and FIG. 10E). That is, a semiconductor device including a channel portion 121 composed of a Ge film or a SiGe film 112, a gate insulating film 122 composed of a high-k film 113, and a gate electrode 123 composed of a conductive film 114, a source electrode 124 and a drain electrode 125, is manufactured. Reference numeral 126 denotes a side wall spacer.

In the semiconductor device manufacturing method described above, after the Ge film or the SiGe film 112 is formed, the substrate is taken out into the air atmosphere and is then loaded into the processing container for the formation of the high-k film 113 to form the high-k film. At this time, the heating at least up to the film formation temperature of the high-k film 113 is performed in the $H_2$ gas atmosphere. Therefore, even if the film formation temperature of the high-k film 113 is a temperature higher than 450 degrees C., for example, a temperature of 500 to 600 degrees C., the etching of the Ge film or the SiGe film 112 is suppressed. As a result, it is possible to reduce the roughness of the interface between the channel portion 121 and the gate insulating film 122 and to increase the carrier mobility. Thus, the high carrier mobility inherent in Ge and SiGe can be exhibited.

Other Applications

Although the embodiments of the present disclosure have been described above, the present disclosure is not limited to the above-described embodiments. Various modifications may be made without departing from the spirit of the present disclosure.

For example, in the above-described embodiments, there has been shown an example in which the heating method of the present disclosure is carried out by the vertical batch type apparatus. However, the present disclosure is not limited thereto. The heating method of the present disclosure may be carried out by various other types of film forming apparatuses such as a horizontal batch type apparatus, a single-substrate type apparatus and the like.

In the above-described embodiments, there has been shown an example in which the present disclosure is applied to a case where the substrate having the Ge film or the SiGe film formed thereon is heated before forming the high-k film. However, the present disclosure is not limited thereto. The present disclosure may be generally applied to a case where the substrate having the Ge film or the SiGe film formed thereon is heated.

According to the present disclosure, a substrate having a germanium film or a silicon germanium film formed on its surface, which is kept in an air atmosphere at least a predetermined time, is loaded into a processing container and is heated in a state in which the inside of the processing container is kept in a hydrogen gas-containing atmosphere, whereby the etching reaction of the germanium film or the silicon germanium film is suppressed and the degradation of the surface of the germanium film or the silicon germanium film can be suppressed even at a high temperature exceeding 450 degrees C.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A heating method for heating a substrate having a germanium film or a silicon germanium film formed on a surface of the substrate, the method comprising:
   loading the substrate kept in an air atmosphere at least a predetermined time into a processing container; and
   heating the substrate in a state in which an interior of the processing container is kept in a hydrogen gas-containing atmosphere.

2. The method of claim 1, wherein a heating temperature of the substrate is a temperature exceeding 450 degrees C.

3. The method of claim 2, wherein in the heating the substrate, the substrate is heated up to a film formation temperature used in which a high dielectric constant film is formed on the germanium film or the silicon germanium film.

4. The method of claim 1, wherein the hydrogen gas-containing atmosphere is an atmosphere containing only a hydrogen gas or an atmosphere containing a hydrogen gas and an inert gas.

5. A film forming method for forming a high dielectric constant film on a substrate having a germanium film or a silicon germanium film formed on a surface of the substrate, the method comprising:
   loading the substrate kept in an air atmosphere at least a predetermined time into a processing container of a film forming apparatus;
   heating the substrate at least up to a film formation temperature in a state in which an interior of the processing container is kept in a hydrogen gas-containing atmosphere; and
   forming the high dielectric constant film on a surface of the germanium film or the silicon germanium film by supplying a film forming raw material gas for forming the high dielectric constant film and an oxidizing gas after the substrate has reached the film formation temperature.

6. The method of claim 5, wherein the film formation temperature is a temperature exceeding 450 degrees C.

7. The method of claim 6, wherein the film formation temperature is 500 to 600 degrees C.

8. The method of claim 5, wherein the hydrogen gas-containing atmosphere comprises an atmosphere containing only a hydrogen gas or an atmosphere containing a hydrogen gas and an inert gas.

9. A semiconductor device manufacturing method, comprising:
   forming a germanium film or a silicon germanium film on a semiconductor substrate via an insulating film;
   forming a high dielectric constant film on the germanium film or the silicon germanium film;
   forming a conductive film on the high dielectric constant film; and
   forming a channel portion comprising the germanium film or the silicon germanium film, a source electrode, a drain electrode, a gate insulating film comprising the high dielectric constant film, and a gate electrode comprising the conductive film, by etching the conductive film and the high dielectric constant film, and by implanting ions into the germanium film or the silicon germanium film,
   wherein after forming the germanium film or the silicon germanium film, the semiconductor substrate kept in an air atmosphere at least a predetermined time is loaded into a processing container of a film forming apparatus for forming the high dielectric constant film, and the semiconductor substrate is heated at least up to a film formation temperature in a state in which an interior of the processing container is kept in a hydrogen gas-containing atmosphere.

* * * * *